US010517455B2

(12) United States Patent
Fay et al.

(10) Patent No.: US 10,517,455 B2
(45) Date of Patent: Dec. 31, 2019

(54) ELECTROSTATIC DISCHARGE SYSTEMS FOR AUTONOMOUS MOBILE ROBOTS

(71) Applicant: iRobot Corporation, Bedford, MA (US)

(72) Inventors: Victor Fay, Andover, MA (US); Travis James Gschrey, Billerica, MA (US)

(73) Assignee: iRobot Corporation, Bedford, MA (US)

( * ) Notice: Subject to any disclaimer, the term of this patent is extended or adjusted under 35 U.S.C. 154(b) by 245 days.

(21) Appl. No.: 15/794,543

(22) Filed: Oct. 26, 2017

(65) Prior Publication Data

US 2019/0125154 A1     May 2, 2019

(51) Int. Cl.
| | |
|---|---|
| *A47L 9/28* | (2006.01) |
| *A47L 5/22* | (2006.01) |
| *A47L 9/04* | (2006.01) |
| *H05K 9/00* | (2006.01) |

(52) U.S. Cl.
CPC .............. *A47L 9/2889* (2013.01); *A47L 5/22* (2013.01); *A47L 9/0411* (2013.01); *A47L 9/0472* (2013.01); *A47L 9/0477* (2013.01); *A47L 9/0488* (2013.01); *A47L 9/2826* (2013.01); *A47L 9/2852* (2013.01); *H05K 9/0067* (2013.01); *A47L 2201/04* (2013.01)

(58) Field of Classification Search
CPC ...... A47L 2201/04; A47L 5/22; A47L 9/0411; A47L 9/0472; A47L 9/0477; A47L 9/0488; A47L 9/2826; A47L 9/2852; A47L 9/2889; H05K 9/0067
See application file for complete search history.

(56) References Cited

U.S. PATENT DOCUMENTS

| | | | | |
|---|---|---|---|---|
| 3,011,188 | A * | 12/1961 | Menche ................ | A47L 9/0411 15/52.1 |
| 4,715,085 | A * | 12/1987 | Johanson .............. | A47L 9/2889 15/339 |
| 4,715,086 | A | 12/1987 | Johanson et al. | |
| 4,912,593 | A * | 3/1990 | Iwao ...................... | A47L 5/365 15/339 |
| 6,301,743 | B1 * | 10/2001 | Cloud ................... | A47L 9/2842 15/339 |
| 8,412,377 | B2 | 4/2013 | Casey et al. | |
| 2007/0234492 | A1 * | 10/2007 | Svendsen ................. | A47L 5/30 15/21.1 |

(Continued)

FOREIGN PATENT DOCUMENTS

EP           0293802 A2 * 12/1988      ............. A47L 5/365

*Primary Examiner* — Marc Carlson
(74) *Attorney, Agent, or Firm* — Fish & Richardson P.C.

(57) ABSTRACT

An autonomous mobile robot includes a housing infrastructure, a drive system including one or more wheels to support the housing infrastructure above a floor surface, a cleaning assembly, electrical circuitry positioned within the robot housing and an electrostatic discharge assembly including an electrostatic discharge member that includes fibers electrically connected to the electrical circuitry and extending, from the electrical circuitry, to an exterior of the housing infrastructure. The electrical circuitry includes a controller to initiate a cleaning operation in which the drive propels the robot across the floor surface while the cleaning assembly cleans the floor surface.

25 Claims, 11 Drawing Sheets

(56) References Cited

U.S. PATENT DOCUMENTS

| | | | |
|---|---|---|---|
| 2010/0037418 A1* | 2/2010 | Hussey | A47L 5/30 15/319 |
| 2010/0306956 A1* | 12/2010 | Follows | A47L 9/0477 15/363 |
| 2010/0306958 A1* | 12/2010 | Follows | A47L 9/0477 15/383 |
| 2010/0306959 A1* | 12/2010 | Follows | A46B 13/005 15/383 |
| 2011/0214248 A1* | 9/2011 | McLeod | A47L 9/0072 15/383 |
| 2012/0011680 A1* | 1/2012 | Owen | A47L 9/04 15/383 |
| 2012/0144621 A1* | 6/2012 | Forbes | A46B 13/008 15/389 |
| 2017/0127896 A1* | 5/2017 | Carter | A47L 5/26 |
| 2017/0215667 A1* | 8/2017 | Thorne | A47L 9/30 |
| 2018/0255991 A1* | 9/2018 | Der Marderosian | A47L 9/0477 |
| 2018/0303304 A1* | 10/2018 | Yang | A46B 1/00 |

\* cited by examiner

ELECTROSTATIC DISCHARGE SYSTEMS FOR AUTONOMOUS MOBILE ROBOTS

TECHNICAL FIELD

This specification relates to electrostatic discharge systems, in particular, for autonomous mobile robots.

BACKGROUND

Autonomous mobile robots include mobile floor cleaning robots that travel along floor surfaces to clean the floor surfaces. As a mobile floor cleaning robot travels along a floor surface, different portions of the robot contact the floor surface. This contact between the robot and the floor surface, through the triboelectric effect, can cause the robot to accumulate electric charge.

SUMMARY

An autonomous mobile robot can include an electrostatic discharge member, such as a brush with fibers. The electrostatic discharge member can release electric charge accumulated on the robot as a result of the robot's travel across a floor surface. The electric charge can be released in a controlled manner to prevent the electric charge from otherwise being abruptly discharged in an uncontrolled manner. The electrostatic discharge member can protect sensitive electrical circuitry of the robot from abrupt electrostatic discharge.

In one aspect, an autonomous mobile robot includes a housing infrastructure, a drive system including one or more wheels to support the housing infrastructure above a floor surface, a cleaning assembly, electrical circuitry positioned within the robot housing and an electrostatic discharge assembly including an electrostatic discharge member that includes fibers electrically connected to the electrical circuitry and extending, from the electrical circuitry, to an exterior of the housing infrastructure. The electrical circuitry includes a controller to initiate a cleaning operation in which the drive propels the robot across the floor surface while the cleaning assembly cleans the floor surface.

In some implementations, the electrostatic discharge assembly includes an assembly housing coupling the electrostatic discharge assembly to the housing infrastructure. The fibers include proximal ends disposed within the assembly housing and distal ends disposed outside of the assembly housing and outside of the housing infrastructure.

In some implementations, the cleaning assembly includes one or more rotatable members configured to contact the floor surface during the cleaning operation, thereby causing the robot to accumulate electrostatic charge. The electrostatic discharge member can be configured to dissipate the accumulated electrostatic charge into an environment of the robot.

In some implementations, the electrostatic discharge member extends downward toward the floor surface.

In some implementations, a distance between a distal tip portion of the electrostatic discharge member and the floor surface is between 0.2 and 1.1 cm.

In some implementations, a height of the robot relative to the floor surface is no more than 13 centimeters. The electrostatic discharge member can be positioned at a rearward portion of the housing infrastructure and along a bottom portion of the housing infrastructure. In some cases, the electrostatic discharge member extends rearwardly from the housing infrastructure.

In some implementations, the electrostatic discharge member is within an outer perimeter of the robot and extends toward a rearmost edge of the robot along an axis that forms an angle between 45 and 90 degrees with the floor surface.

In some implementations, a minimum distance between a distal tip portion of the electrostatic discharge member and an exterior wall of the housing infrastructure is at least 1 millimeter.

In some implementations, an exterior wall of the housing infrastructure includes a first portion recessed inwardly relative to a second portion surrounding the first portion. The electrostatic discharge member can extend out of the housing infrastructure through the first portion of the exterior wall. A minimum distance between the distal tip portion and the second portion of the housing infrastructure can be at least 1 millimeter. In some cases, the fibers include distal tips, and minimum distances between the distal tips and the exterior surface of the body are non-uniform. In some cases, the minimum distances are no more than 1.25 mm. In some cases, a maximum distance between any two of the distal tips no more than 1.25 mm. In some cases, a diameter of each of the fibers is between 1 and 10 micrometers. In some cases, for each of the fibers, a length between a proximal end of a fiber and a distal end of the fiber is between 3 and 20 millimeters.

In some implementations, a distance between a distal tip portion of the electrostatic discharge member and a rearmost edge of the housing infrastructure is between 1% and 5% of a length of the robot.

In some implementations, a bottom surface of the housing is no more than 0.7 cm from the floor surface, and the electrostatic discharge member is positioned above the floor surface such that the electrostatic discharge member does not contact the floor surface during the cleaning operation on the floor surface.

In some implementations, the robot further includes an assembly housing to which the electrostatic discharge member is mounted. The assembly housing can include a locator member engaged with a corresponding locator member on the housing infrastructure to inhibit relative movement of the portion of the electrical circuitry and the electrostatic discharge member.

In some implementations, the robot further includes a resistor electrically connecting the electrostatic discharge member and the electrical circuitry.

In some implementations, an electrical resistance of the electrical resistor is between 1 Kilo-Ohm and 1 Mega-Ohm.

In some implementations, the electrostatic discharge member is connected to an electrical ground of the electrical circuitry.

In some implementations, the electrostatic discharge member is electrically connected to the electrical circuitry through an electrical wire.

Advantages of the foregoing may include, but are not limited to, those described below and herein elsewhere. For example, the electrostatic discharge assembly can dissipate electrostatic charge that is accumulated by the autonomous mobile robot, for example, during the cleaning operation. This can reduce the likelihood that the electrostatic charge is suddenly discharged in a manner that can damage electrical circuitry of the robot, shock an individual, etc. The electrostatic discharge assembly enables the electrostatic charge to be transferred to a surrounding environment of the robot in a controlled manner that minimizes the risk of damage to the electrical circuitry.

The details of one or more implementations of the subject matter described in this specification are set forth in the accompanying drawings and the description below. Other potential features, aspects, and advantages will become apparent from the description, the drawings, and the claims.

DETAILED DESCRIPTION

Figure 1A:
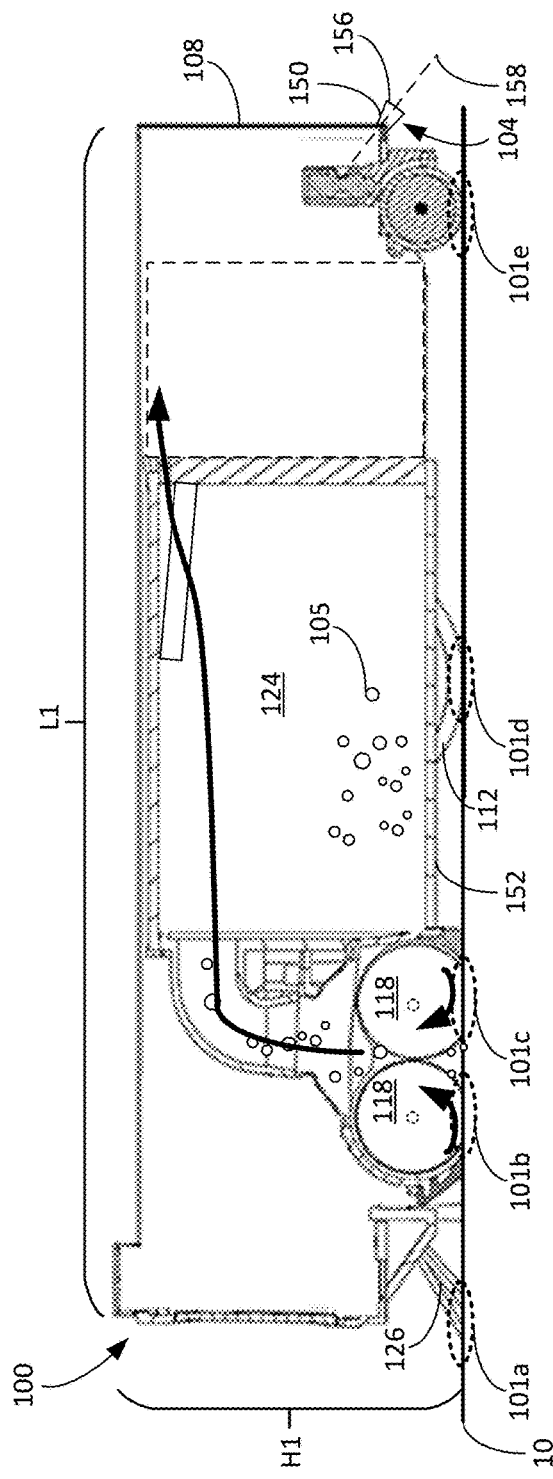
FIG. 1A is a schematic side view of an autonomous mobile robot with an electrostatic discharge assembly during a cleaning operation.

Referring to FIG. 1A, an autonomous mobile robot 100 autonomously moves about a floor surface 10 in an environment, e.g., a room, an office, or other enclosed space. For example, the robot 100 is an autonomous mobile floor cleaning robot that performs a cleaning operation in which the robot 100 is propelled across the floor surface 10 while the robot 100 cleans the floor surface. During the cleaning operation, referring to FIG. 1B, the robot 100 accumulates electric charge (e.g., negative charge 102) due to contact between exterior portions of the robot 100 and the floor surface 10. Several regions of contact 101a-101e (shown in FIG. 1A) between the robot 100 and the floor surface 10 cause the robot 100 to accumulate electric charge. As described herein, the robot 100 includes an electrostatic discharge assembly 102 that dissipates the electric charge 102 to mitigate any risk of damage to electrical circuitry 106 of the robot 100 that may occur as a result of abrupt discharge of the electric charge 102.

Figure 2A:
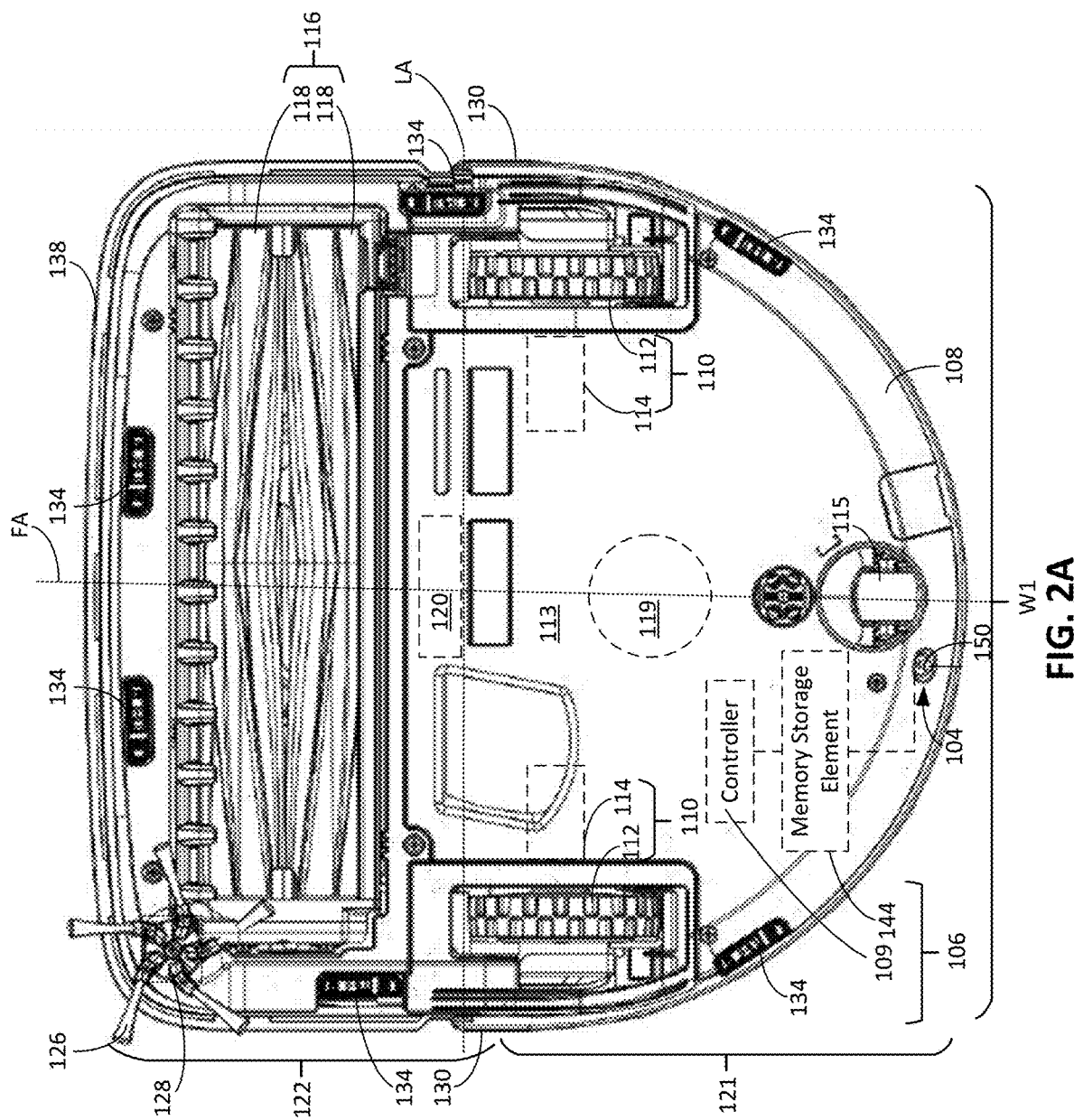
FIGS. 2A-2E are bottom, front perspective, rear bottom perspective, rear, and side views, respectively, of the robot of FIG. 1A.

FIGS. 2A-2E depict an example of the robot 100. Referring to FIG. 2A, the robot 100 includes a robot housing infrastructure 108. The housing infrastructure 108 can define the structural periphery of the robot 100. In some examples, the housing infrastructure 108 includes a chassis, cover, bottom plate, and bumper assembly. The robot 100 is a household robot that has a small profile so that the robot 100 can fit under furniture within a home. For example, a height H1 (shown in FIG. 1A) of the robot 100 relative to the floor surface is, for example, no more than 13 centimeters. A bottom horizontal surface 152 (shown in FIG. 1A) of the robot housing 108 is no more than 0.7 cm from the floor surface. The robot 100 is also compact. An overall length L1 (shown in FIG. 1A) of the robot 100 an overall width W1 (shown in FIG. 2A) are each between 30 and 60 centimeters, e.g., between 30 and 40 centimeters, 40 and 50 centimeters, or 50 and 60 centimeters.

The robot 100 includes a drive system 110 including one or more drive wheels. The drive system 110 further includes one or more electric motors including electrically driven portions forming part of the electrical circuitry 106. The housing infrastructure 108 supports the electrical circuitry 106, including at least a controller 109, within the robot 100.

The drive system 110 is operable to propel the robot 100 across the floor surface 10. In the example depicted in FIG. 2A, the robot 100 includes drive wheels 112 extending through a bottom portion 113 of the housing infrastructure 108. The drive wheels 112 are rotated by motors 114 to cause movement of the robot 100 along the floor surface 10. The robot 100 further includes a passive caster wheel 115 extending through the bottom portion 113 of the housing infrastructure 108. The caster wheel 115 is not powered. Together, the drive wheels 112 and the caster wheel 115 cooperate to support the housing infrastructure 108 above the floor surface 10. For example, the caster wheel 115 is disposed along a rearward portion 121 of the housing infrastructure 108, and the drive wheels 112 are disposed forward of the caster wheel 115.

In the example depicted in FIGS. 1A and 2A-2D, the robot 100 is an autonomous mobile floor cleaning robot that includes a cleaning assembly 116 (shown in FIG. 2A) operable to clean the floor surface 10. For example, the robot 100 is a vacuum cleaning robot in which the cleaning assembly 116 is operable to clean the floor surface 10 by ingesting debris 105 (shown in FIG. 1A) from the floor surface 10. The cleaning assembly 116 includes one or more rotatable members, e.g., rotatable members 118 driven by a motor 120. The rotatable members 118 are positioned along a forward portion 122 of the housing infrastructure 108, and extend along 75% to 95% of a width of the forward portion 122 of the housing infrastructure 108, e.g., corresponding to an overall width W1 of the robot 100.

As shown in FIG. 2A, the rotatable members 118 are rollers that counterrotate relative to one another. The rotatable members 118 include elastomeric shells that contact debris 105 on the floor surface 10 to direct debris 105 through a gap between the rotatable members 118 and into an interior of the robot 100, e.g., into a debris bin 124 (shown in FIG. 1A), as the rotatable members 118 rotate relative to the housing infrastructure 108. The rotatable members 118 further contact the floor surface 10 to agitate debris 105 on the floor surface 10.

The robot 100 further includes a vacuum assembly 119 operable to generate an airflow through the gap between the rotatable members 118 and into the debris bin 124. The vacuum assembly 119 includes an impeller and a motor to rotate the impeller to generate the airflow. The vacuum assembly 119 cooperates with the cleaning assembly 116 to draw debris 105 from the floor surface 10 into the debris bin 124. In some cases, the airflow generated by the vacuum assembly 119 creates sufficient force to draw debris 105 on the floor surface 10 upward through the gap between the rotatable members 118 into the debris bin 124. In some cases, the rotatable members 118 contact the floor surface 10 to agitate the debris 105 on the floor surface 10, thereby allowing the debris 105 to be more easily ingested by the airflow generated by the vacuum assembly 119.

The robot 100 further includes a brush 126 that rotates about a non-horizontal axis, e.g., an axis forming an angle between 75 degrees and 90 degrees with the floor surface 10. The non-horizontal axis, for example, forms an angle between 75 degrees and 90 degrees with the longitudinal axes of the rotatable members 118. The robot 100 includes a motor 128 operably connected to the brush 126. The brush 126 is a side brush laterally offset from a fore-aft axis FA of the robot 100 such that the brush 126 extends beyond one of the lateral sides 130 of the housing infrastructure 108 and is thereby capable of engaging debris on portions of the floor surface 10 that the rollers 118 typically cannot reach, e.g., portions of the floor surface 10 outside of a portion of the floor surface 10 directly underneath the robot 100. The brush 126 is also forwardly offset from a lateral axis LA of the robot 100 such that the brush 126 also extends beyond a front surface of the housing infrastructure 108. The brush 126 is positioned to contact the floor surface 10 during its rotation so that the brush 126 can easily engage the debris 105 on the floor surface 10.

The electrical circuitry 106 includes, in addition to the controller 109, a memory storage element 144 and a sensor system with one or more electrical sensors. The memory storage element 144 is accessible by the controller 109 and disposed within the housing infrastructure 108. The one or more electrical sensors are configured to detect features in an environment of the robot 100. For example, the sensor system includes cliff sensors 134 disposed along the bottom portion 113 of the housing infrastructure 108. Each of the cliff sensors 134 is an optical sensor that can detect the presence or the absence of an object below the optical sensor, such as the floor surface 10. The cliff sensors 134 can thus detect obstacles such as drop-offs and cliffs below portions of the robot 100 where the cliff sensors 134 are disposed and redirect the robot accordingly.

Figure 2B:
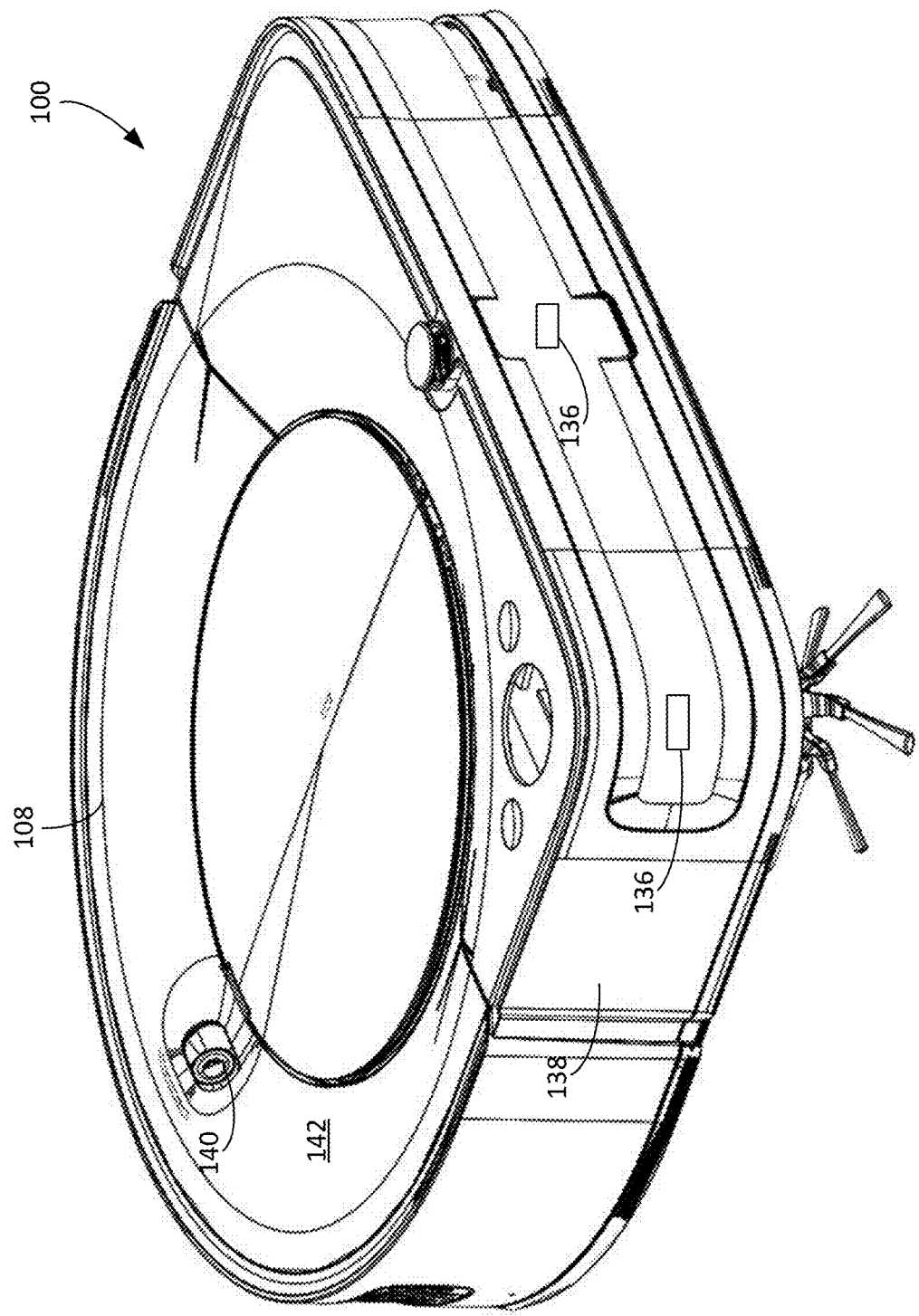

Referring to FIG. 2B, the sensor system includes proximity sensors 136 disposed proximate the front surface of the housing infrastructure 108. Each of the proximity sensors 136 is an optical sensor facing outward from the front surface of the housing infrastructure 108 and that can detect the presence or the absence of an object in front of the optical sensor. For example, the detectable objects include obstacles such as furniture, walls, persons, and other objects in the environment of the robot 100.

The sensor system includes a bumper system including the bumper 138 and a bumper sensor (not shown) that detect contact between the bumper 138 and obstacles in the environment. The bumper 138 forms part of the housing infrastructure 108. The proximity sensors 136 can detect objects before the robot 100 contacts the objects, and the bumper sensor can detect objects that contact the bumper 138.

The sensor system further includes an image capture device 140, e.g., a camera, directed toward a top portion 142 of the housing infrastructure 108. The image capture device 140 generates digital imagery of the environment of the robot 100 as the robot 100 moves about the floor surface 10. The image capture device 140 is angled in an upward direction, e.g., angled between 30 degrees and 80 degrees from the floor surface 10 about which the robot 100 navigates. The camera, when angled upward, is able to capture images of wall surfaces of the environment so that features corresponding to objects on the wall surfaces can be used for localization.

When the controller 109 causes the robot 100 to perform the mission, the controller 109 operates the motors 114 to drive the drive wheels 112 and propel the robot 100 along the floor surface 10. In addition, the controller 109 operates the motor 120 to cause the rotatable members 118 to rotate, operates the motor 128 to cause the brush 126 to rotate, and operates the motor of the vacuum assembly 119 to generate the airflow. To cause the robot 100 to perform various navigational and cleaning behaviors, the controller 109 executes software stored on the memory storage element 144 to cause the robot 100 to perform by operating the various motors of the robot 100. The controller 109 operates the various motors of the robot 100 to cause the robot 100 to perform the behaviors.

The controller 109 uses data collected by the sensors of the sensor system to control navigational behaviors of the robot 100 during the mission. For example, the controller 109 uses the sensor data collected by obstacle detection sensors of the robot 100, e.g., the cliff sensors 134, the proximity sensors 136, and the bumper sensor, to enable the robot 100 to avoid obstacles within the environment of the robot 100 during the mission.

The sensor data can be used by the controller 109 for simultaneous localization and mapping (SLAM) techniques in which the controller 109 extracts features of the environment 10 represented by the sensor data and constructs a map of the floor surface 10 of the environment. The sensor data collected by the image capture device 140 can be used for techniques such as vision-based SLAM (VSLAM) in which the controller 109 extracts visual features corresponding to objects in the environment and constructs the map using these visual features. As the controller 109 directs the robot 100 about the floor surface 10 during the mission, the controller 109 uses SLAM techniques to determine a location of the robot 100 within the map by detecting features represented in collected sensor data and comparing the features to previously stored features. The map formed from the sensor data can indicate locations of traversable and nontraversable space within the environment. For example, locations of obstacles are indicated on the map as traversable space, and locations of open floor space are indicated on the map as nontraversable space.

The sensor data collected by any of the sensors can be stored in the memory storage element 144. In addition, other data generated for the SLAM techniques, including mapping data forming the map, can be stored in the memory storage element 144. These data produced during the mission can include persistent data that are produced during the mission and that are usable during another mission. For example, the other mission is a subsequent mission occurring after the mission. In addition to storing the software for causing the robot 100 to perform its behaviors, the memory storage element 144 stores sensor data or data resulting from processing of the sensor data for access by the controller 109 from one mission to another mission. For example, the map is a persistent map that is usable and updateable by the controller 109 of the robot 100 from one mission to another mission to navigate the robot 100 about the floor surface 10.

The persistent data, including the persistent map, enables the robot 100 to efficiently clean the floor surface 10. For example, the persistent map enables the controller 109 to direct the robot 100 toward open floor space and to avoid nontraversable space. In addition, for subsequent missions, the controller 109 is able to plan navigation of the robot 100 through the environment using the persistent map to optimize paths taken during the missions.

In this regard, the robot 100 includes mechanisms to protect the persistent data from being corrupted so that the cleaning efficiency of the robot 100 can be maintained. The data could be corrupted by electrical interference introduced into the electrical circuitry 106. To inhibit the likelihood of data corruption, the robot 100 includes mechanisms to inhibit sudden electrostatic discharge that could cause loss of stored data, e.g., including the persistent map or any software stored on the memory storage element 144.

Figure 1B:
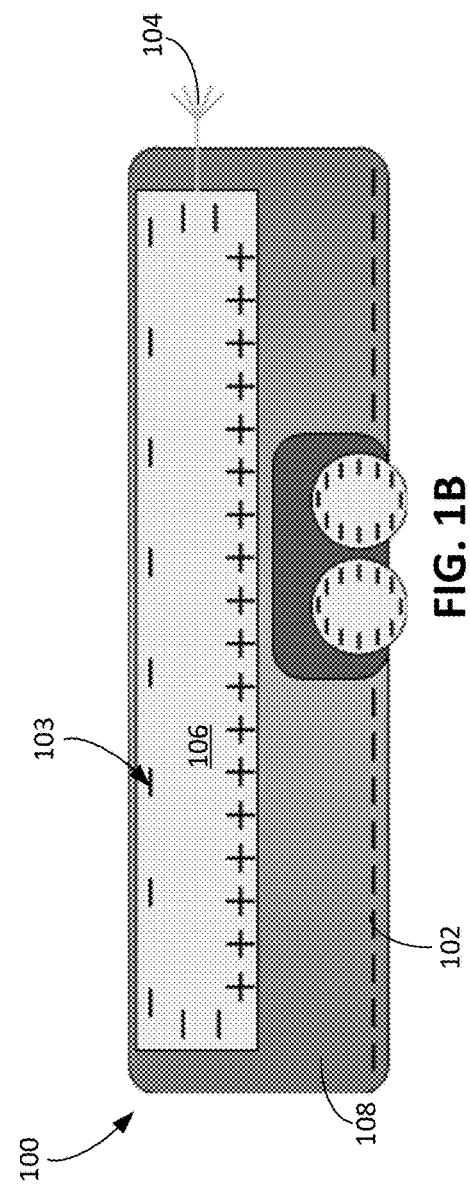
FIG. 1B is a schematic side view of the robot of FIG. 1A, schematically depicting an accumulation of electric charge on the robot.

The sudden electrostatic discharge can occur as a result of accumulated electrostatic charge on the robot 100. During the mission, as the robot 100 is propelled along the floor surface 10 to clean the floor surface 10, exterior portions of the robot 100 contact the floor surface 10 and, as a result of the triboelectric effect, accumulate the electric charge 102, as shown in FIG. 1B. For example, these exterior portions include portions of the drive wheels 112, the caster wheel 115, the bottom portion 113 of the housing infrastructure 108, and the rotatable members 118. As shown in FIG. 1A, the brush 126 contacts the floor surface 10 in the region of contact 101*a*. The rotatable members 118 contact the floor surface 10 in the regions of contact 101*b*, 101*c*. The drive wheels 112 contact the floor surface in the regions of contact 101*d*. The caster wheel 115 contacts the floor surface 10 in the region of contact 101*e*. Other components, including the housing infrastructure 108, can contact the floor surface 10 and collect electric charge 102. For example, if the floor surface 10 includes carpet, the carpet can include fibers that extend upwardly a sufficient distance to contact the bottom portion of the housing infrastructure 108. Some or all of these components of the robot 100 include plastic components that accumulate the electric charge 102 but cannot easily dissipate the electric charge 102.

Due to electrostatic induction and direct charge transfer from the charged plastic components to the electrical circuitry 106 (e.g., through the ionization and creepage), the electrostatic potential of the electrical circuitry 106 increases. For example, the electric charge 102 can induce an electric charge 103 on the electrical circuitry 106 of the robot 100. When a conductive portion of the robot 100 is positioned near an external conductive object, the electric charge 103 can abruptly discharge from the robot 100 to the external conductive object, potentially damaging the electrical circuitry 106 or causing loss of data stored on the memory storage element 144.

Referring to FIG. 1B, the robot 100 includes the electrostatic discharge assembly 104 that dissipates the electric charge 103 into the environment of the robot 100. The electrostatic discharge assembly 104 dissipates the electric charge 103 at a rate that at least partially counteracts the rate at which the electric charge 102 is accumulated on the plastic components of the robot and the rate at which the negative electric charge 103 is induced by electrostatic induction and charge transfer, into the electrical circuit 106. When the robot 100 is travelling along the floor surface 10, the electrostatic discharge assembly 104 can maintain a lower potential on the electrical circuitry 106, thereby reducing the risk of sudden electrostatic discharge. In particular, the electrostatic discharge assembly 104 can reduce the intensity of sudden electrostatic discharges such that if a sudden electrostatic discharge occurs, the discharge poses little risk to the electrical circuitry 106.

Referring to FIG. 2A, the electrostatic discharge assembly 104 includes an electrostatic discharge member 150 electrically connected to the electrical circuitry 106 and configured to dissipate the electric charge 103 into the environment of the robot 100. The electrostatic discharge member 150 is a conductive member that is positioned near the floor surface 10, to increase the rate of electrostatic discharge from the robot 100.

The electrostatic discharge member 150 is positioned at the rearward portion 121 of the housing infrastructure 108 and along the bottom portion 113 of the housing infrastructure 108, to increase the strength of the electric field and the discharge rate. The electrostatic discharge member 150 is within an outer perimeter of the robot 100 and within an outer perimeter of the housing infrastructure 108.

Figure 2C:
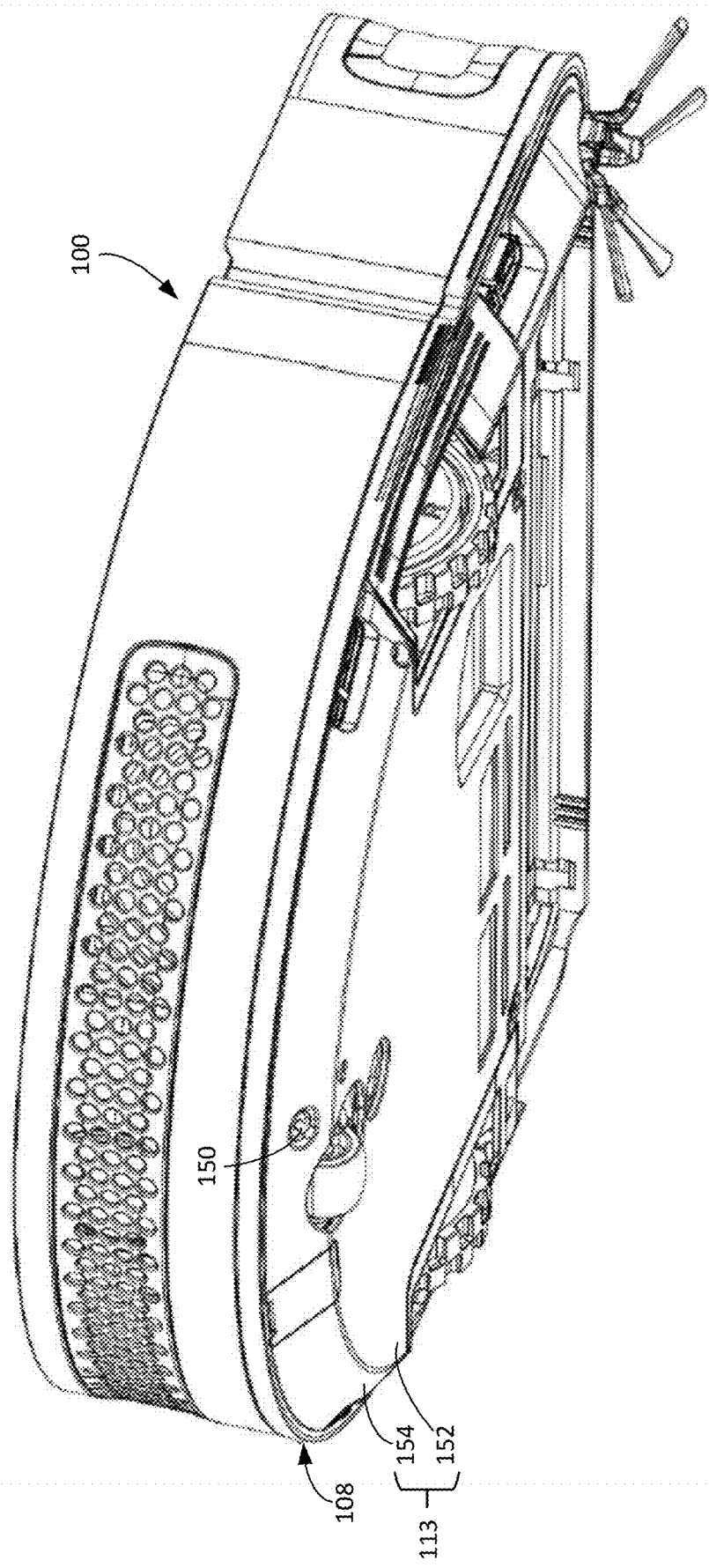
Figure 2D:
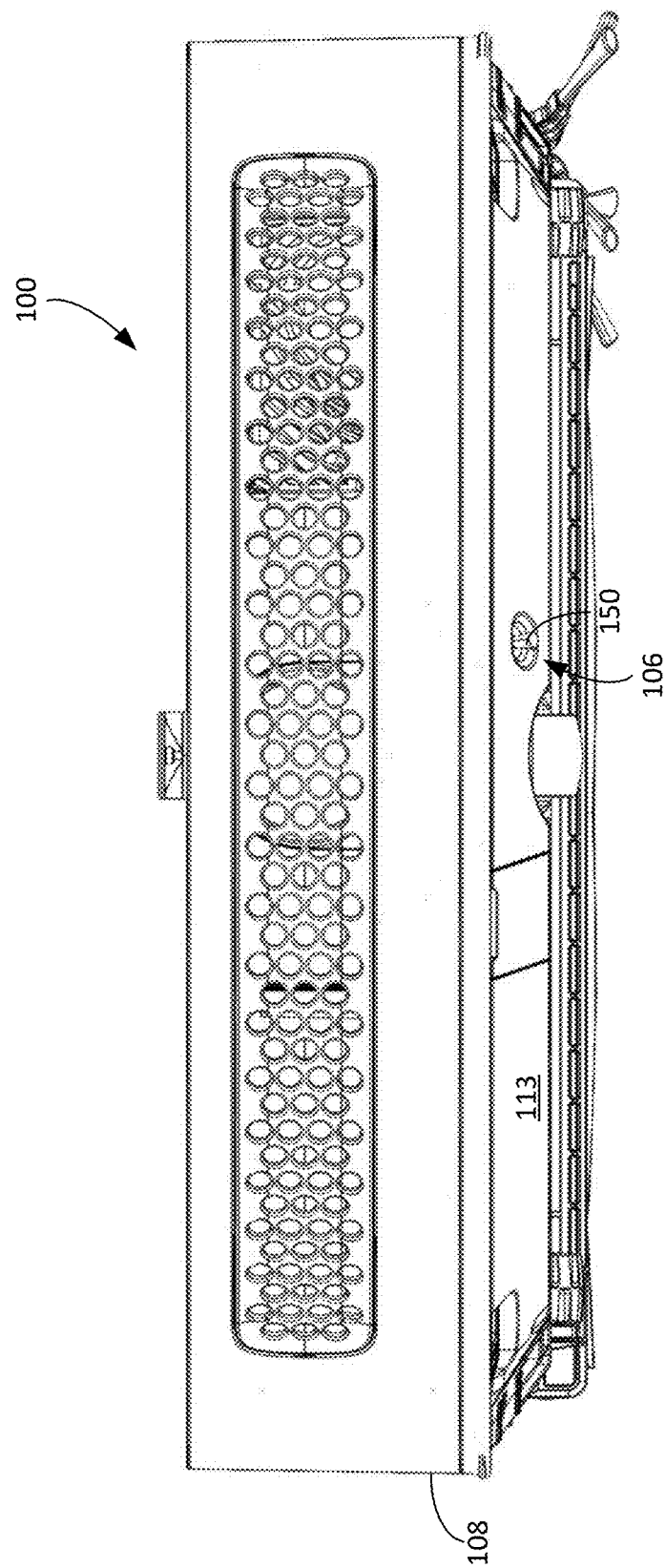
Figure 2E:
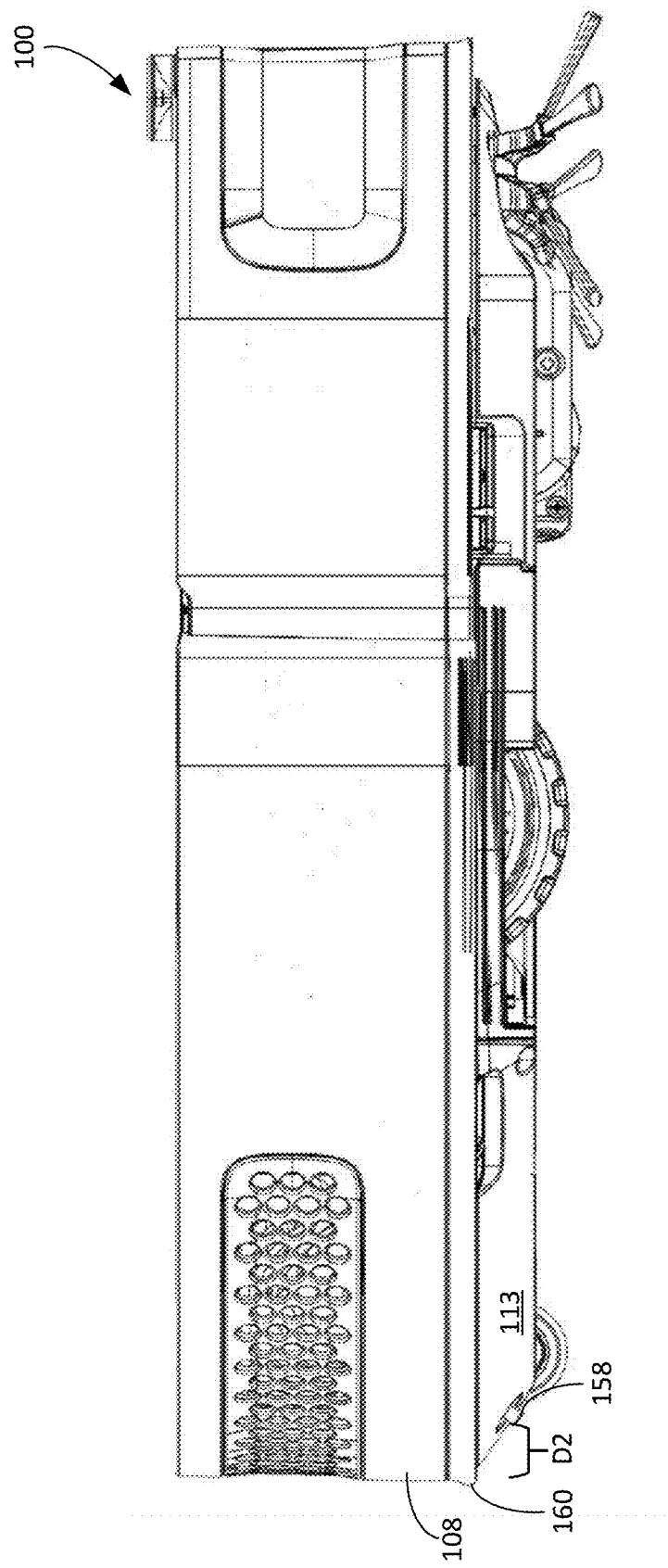

As shown in FIGS. 2A and 2C-2E, the electrostatic discharge member 150 extends, from the electrical circuitry 106, through the bottom portion 113 of the housing infrastructure 108 to an exterior of the housing infrastructure 108. For example, as shown in FIG. 2C, the bottom portion 113 of the housing infrastructure 108 corresponds to a bottom facing portion of the housing infrastructure 108 and includes the horizontal bottom surface 152 and an angled surface 154. The electrostatic discharge member 150 extends through the angled surface 154 of the bottom portion 113. The horizontal bottom surface 152 is parallel to the floor surface 10, and the angle surface 154 and the horizontal bottom surface 152 form an angle between 30 and 60 degrees.

Referring back to FIG. 1A, the electrostatic discharge member 150 extends rearwardly from the housing infrastructure 108 and downward toward the floor surface 10. A distance D1 (shown in FIG. 1A) between a distal tip portion 156 of the electrostatic discharge member 150 and the floor surface 10 is between 0.2 and 1.1 cm. The distance D1 may vary depending on the type of the floor surface 10 on which the robot 100 is positioned. For example, if the floor surface 10 includes carpet, the distance D1 may be between 0.2 cm and 0.8 cm, while the distance D1 may be between 0.8 cm and 1.1 cm if the floor surface 10 is a hard surface. The electrostatic discharge member 150 is positioned above the floor surface 10 such that the electrostatic discharge member 150 does not normally contact the floor surface 10 during the mission and while the robot 100 travels along the floor surface 10. For example, depending on the type of the floor surface 10, the electrostatic discharge member intermittently contacts the floor surface 10. If the floor surface 10 is a hard surface, the electrostatic discharge member 150 tends to not contact the floor surface 10 as the robot 100 travels across the floor surface 10, whereas if the floor surface 10 is a carpet, the electrostatic discharge member 150 may occasionally contact the floor surface 10 as the robot 100 travels across the floor surface 10. By being positioned near the floor surface 10, the electrostatic discharge member 150 can discharge electrostatic charge of the robot 100 more quickly, thus rendering the electrostatic discharge member 150 more effective.

The electrostatic discharge member 150 extends toward a rearmost edge of the robot 100 along an axis 158 that forms an angle between 45 and 90 degrees with the floor surface 10. Referring back to FIG. 2E, a distance D2 between the distal tip portion 156 of the electrostatic discharge member 150 and a rearmost edge 160 of the housing infrastructure 108 is between 1% and 5% of the overall length L1 of the robot 100. For example, the distance D2 can be between 0.5 cm and 3 cm from the rearmost edge 160 of the robot. As the robot 100 is travelling on the floor surface 10, the electrostatic discharge member 150 (by being near a rearward edge of the robot 100) is positioned proximate portions of the floor surface 10 that the forward portion 122 of the robot 100 charged through contact. The electric field is increased around the electrostatic discharge member 150, and the rate of discharge is accordingly increased.

Figure 3:
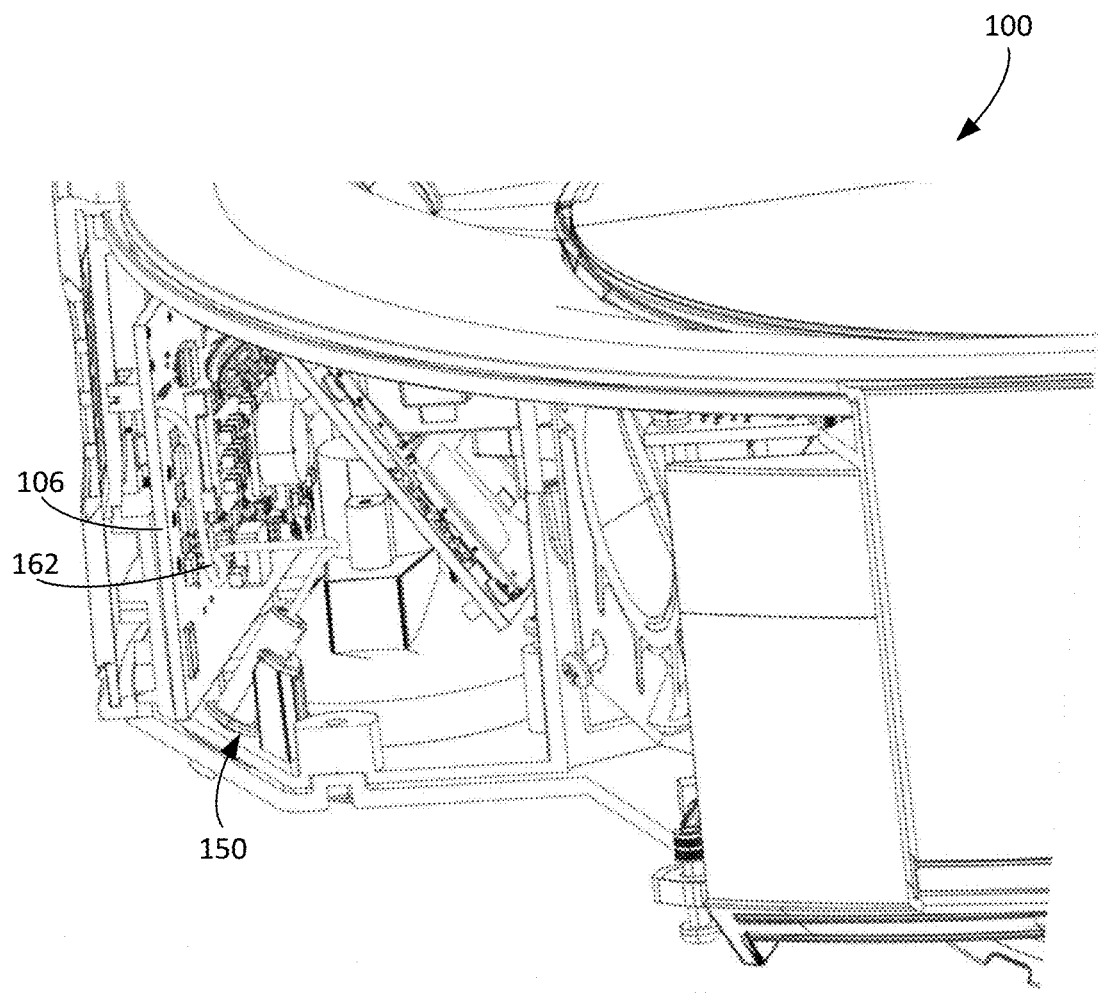
FIG. 3 is a side cutaway view of an interior portion of the robot of FIG. 1A.

Referring to FIG. 3, the electrostatic discharge member 150 is electrically connected to the electrical circuitry 106 through an electrical wire 162. For example, the electrical wire 162 connects the electrostatic discharge member 150 to a ground terminal, e.g., to an electric ground 164 (shown in FIG. 4) of the electrical circuitry 106. In some implementations, referring to FIG. 4, the electrical circuitry 106 includes an electrical resistor 166 electrically connecting the electrostatic discharge member 150 to the electrical circuitry 106. The electrical resistor 166 electrically connects the electric ground 164 (e.g., of the circuitry 106) and the electrostatic discharge member 150 and increases the electrical resistance between the electric ground 164 and the electrostatic discharge member 150. The electric resistor 166 has an electrical resistance between 1 Kilo-Ohm and 1

Mega-Ohm. This increased electrical resistance can reduce the discharge current through the electrostatic discharge member 150 to reduce the risk of sudden electrostatic discharge through the electrostatic discharge member 150. For example, the electrical resistor 166 can prevent high discharge current through the electrostatic discharge member 150 if the electrostatic discharge member 150 comes into contact with an external conductive object, e.g., a human user, a metal threshold, or other external conductive object.

Figure 4:
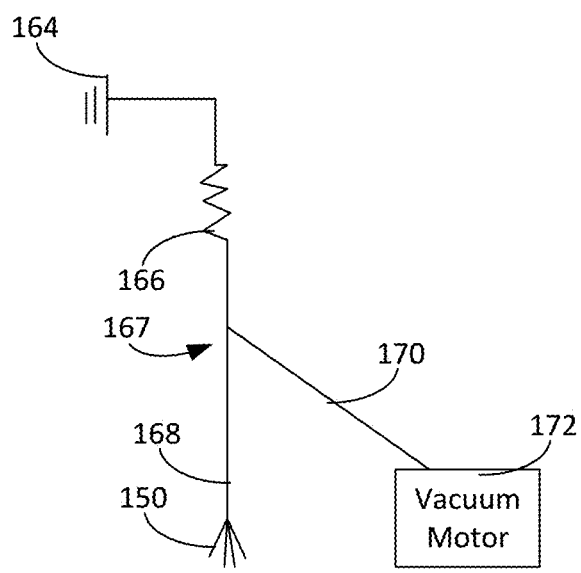
FIG. 4 is a diagram of an electrical circuit including the electrostatic discharge assembly of FIG. 1A.

In some implementations, as depicted in FIG. 4, an electrical connector 167 electrically connecting the electrostatic discharge member 150 to the electric ground 164 includes a first electrical node 168 for the electrostatic discharge member 150 and a second electrical node 170 for another electrical component of the robot 100. For example, the first electrical node 168 of the electrical connector 167 is connected to the electrostatic discharge member 150, the second electrical node 170 of the electrical connector 167 is connected to a vacuum motor 172 (e.g., the motor of the vacuum assembly 119). This ensures a grounded connection rather than a floating connection for the vacuum motor 172.

Figure 5:
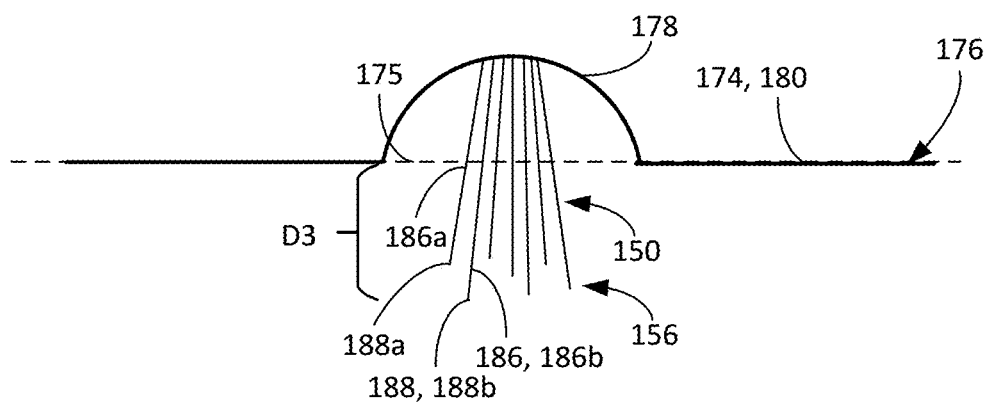
FIG. 5 is a diagram that models a portion of an electrostatic discharge assembly protruding from a robot housing.

Referring to FIG. 5, the distal tip portion 156 of the electrostatic discharge member 150 extends outwardly from the housing infrastructure 108 a sufficient distance to enable electrostatic charge to be dissipated away from the robot 100 and toward objects in the environment, e.g., the air, the floor surface 10, and other environmental objects. By extending beyond the housing infrastructure 108, a minimum distance D3 between the distal tip portion 156 of the electrostatic discharge member 150 and a plane 175 along which an exterior surface 174 of the housing infrastructure 108 extends is at least 1 millimeter, at least 2 millimeters, or at least 3 millimeters. The exterior surface 174 corresponds to an exterior surface of the bottom portion 113 (shown in FIG. 2C) of the housing infrastructure 108. Such an arrangement between the distal tip portion 156 and the housing infrastructure 108 can prevent the dissipated charge from accumulating on the housing infrastructure 108 and slowing down the discharge process from the robot 100. For example, the arrangement can reduce the portion of the paths of discharge of accumulated charge from the electrostatic discharge member 150 that the housing infrastructure 108 blocks. In particular, by extending beyond the housing infrastructure 108, additional paths of electrostatic discharge are made available for the electrostatic discharge member 150.

Figure 6A:
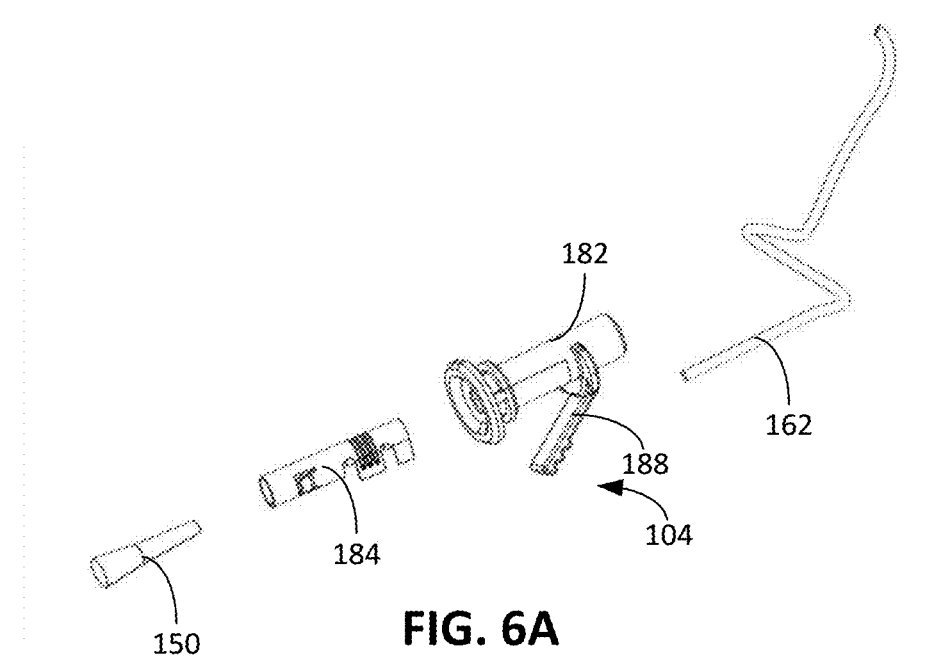
FIGS. 6A-6C are side perspective exploded, side perspective, and side perspective cutaway views, respectively, of the electrostatic discharge assembly of FIG. 1A.
Figure 6B:
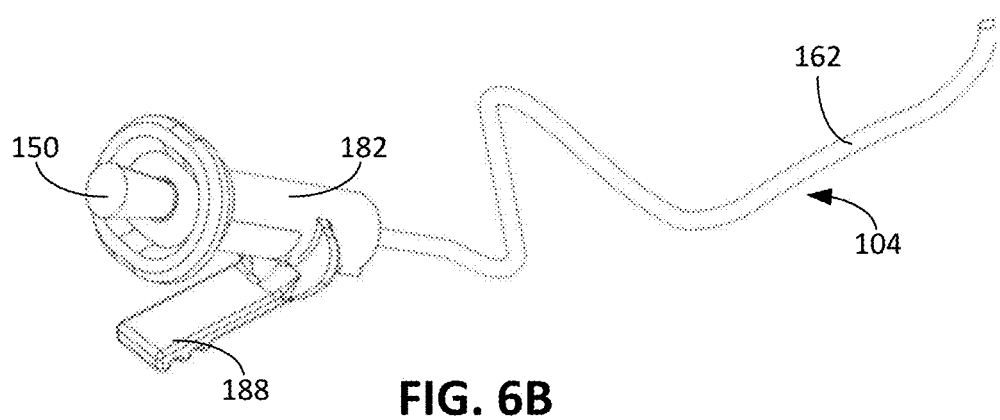
Figure 6C:
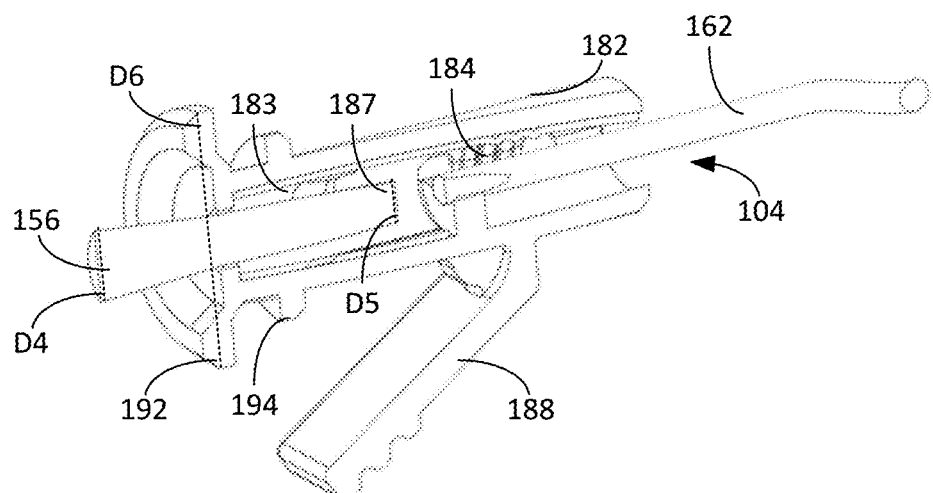

FIGS. 6A-6C illustrate an example configuration of the electrostatic discharge assembly 104. In addition to including the electrostatic discharge member 150 and the electrical wire 162, the electrostatic discharge assembly 104 includes an assembly housing 182 and a crimp sleeve 184. The electrostatic discharge member 150 of the electrostatic discharge assembly 104 corresponds to a brush including a bundle of fibers 186 (individually represented in FIG. 5) that are each electrically connected to the electrical circuitry 106. The fibers 186 are flexible members that are at least partially disposed outside of the housing infrastructure 108. The fibers 186 protrude from the housing infrastructure 108, and are positioned on an exterior of the robot 100 to enable the fibers 186 to discharge electric charge into the environment of the robot 100. The electrostatic discharge member 150 includes between 100 and 10,000 fibers.

A proximal end portion 187 of the electrostatic discharge member 150 is positioned within the assembly housing 182 and within the crimp sleeve 184. The fibers 186 are bundled together within the crimp sleeve 184. In this regard, the fibers 186 are at least partially disposed within the assembly housing 182. The distal tip portion 156 of the electrostatic discharge member 150 is positioned outside of the assembly housing 182 and outside of the housing infrastructure 108 of the robot 100. The fibers 186 extend through the assembly housing 182 such that the fibers 182 are at least partially disposed outside of the assembly housing 186 and outside of the housing infrastructure 108, with proximal ends of the fibers 186 being within the assembly housing 180 and distal ends of the fibers 186 being outside of the assembly housing 180. The crimp sleeve 184 is crimped onto the proximal end portion 187 of the electrostatic discharge member 150 so that the fibers 186 are electrically connected to the electrical wire 162, which in turn electrically connects the fibers 186 to the electrical circuitry 106.

The fibers 186 are formed of a carbon fiber material. In some other implementations, the fibers 186 are formed of stainless steel, conductive acrylic, or other conductive material. A diameter of each of the fibers 186 is between 1 and 10 micrometers. At least a portion of each of the fibers 186 is positioned within the assembly housing 182, extends through the assembly housing 182, and terminates outside of the assembly housing 182. The fibers 186 fan out from the assembly housing 182, thereby providing the electrostatic discharge member 150 with a greater amount of surface area from which electrostatic charge is discharged and more redundant potential discharge paths than would be present if the electrostatic discharge member were a unitary piece of material extending from the assembly housing 182. In this regard, while a diameter D4 of the fibers 186 at the distal tip portion 156 is between 0.1 mm and 10 mm (e.g., between 0.1 mm and 1 mm, 1 mm and 5 mm, or 5 mm and 10 mm), a diameter D5 of the fibers 186 where the fibers 186 are crimped by the crimp sleeve 184 (e.g., at the proximal end portion 187) is between 0.1 mm and 5 mm (e.g., between 0.1 mm and 1 mm, 1 mm and 3 mm, and 3 mm and 5 mm).

Referring back to FIG. 5, the electrostatic discharge member 150 can have improved electrostatic discharge when the electrostatic discharge member 150 includes sharp geometry, e.g., corners and other non-linear geometry. The distal tip portion 156 of the electrostatic discharge member 150 has a non-uniform geometry to achieve this sharp geometry. Minimum distances between distal tips 188 of the fibers 186 and the plane 175 are non-uniform. In this regard, the fibers 186 extend different distances from the housing infrastructure 108. The minimum distances between the distal tips 188 and the plane 175 are between 0 mm and 1.25 mm, e.g., no more than 1.25 mm. A maximum distance between any two of the distal tips 188, e.g., between a distal tip 188a of a shorter fiber 186a and a distal tip 188b of a longer fiber 186b, is between 0 and 1.25 mm, e.g., no more than 1.25 mm. The overall lengths of the fibers are between 3 mm and 20 mm, e.g., between 3 mm and 5 mm, 5 mm and 10 mm, or 10 mm and 20 mm. In some implementations, some of the distal tips 188 are positioned further from the plane 175 than a majority of the distal tips 188. The discharge from the electrostatic discharge member 150 improves if a relatively small number of individual fibers extend beyond the majority of the fibers by at least 1 mm. For example, the distal tip 188b of a longer fiber 186b can be one of a minority of the fibers that are outstanding. The distal tip 188b extends beyond the distal tip 188a of a shorter fiber 186a, which is a one of a majority of the distal tips of the discharge member 150.

Figure 7:
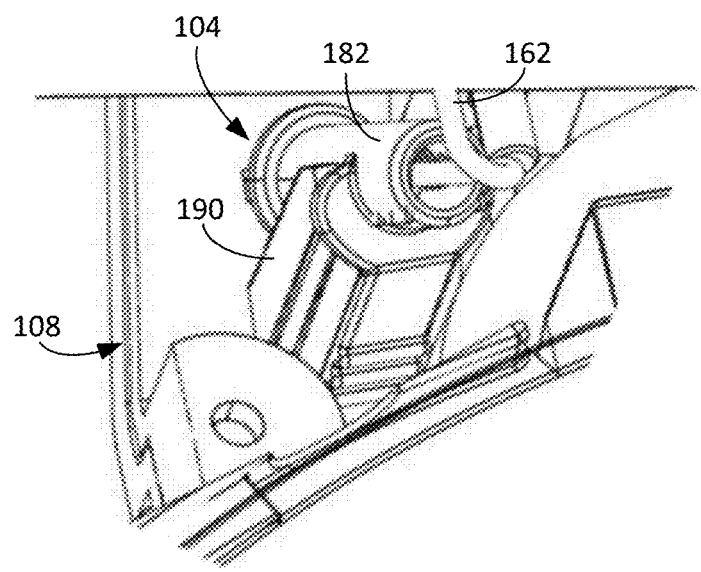
FIG. 7 is a top perspective view of a support structure for the electrostatic discharge assembly of FIG. 1A.

The fibers 186 are joined within the assembly housing 182. The assembly housing 182 is an elastomeric component including a through-hole 183 through which the electrostatic member 150, the crimp sleeve 184, and the electric wire 162 extends. The assembly housing 182 includes features to attach the electrostatic discharge assembly 104 to the housing infrastructure 108. For example, the assembly housing 182 includes a locator member 188 (shown in FIGS. 6A-6C) that mates with a corresponding locator member 190 on the housing infrastructure 108 (shown in FIG. 7). The engagement between the locator member 188 and the locator member 190 inhibits relative rotation of the assembly housing 182 and the housing infrastructure 108. An outer diameter D6 of the locator member 188 is between 0.1 mm and 20 mm.

The assembly housing 182 further include locking members 192, 194 (shown in FIG. 6C) that engage with the bottom portion 113 of the housing infrastructure 108 to inhibit relative movement between the housing infrastructure 108 and the electrostatic discharge assembly 104. For example, the locking member 192 engages an interior surface of the housing infrastructure 108, and the locking member 194 engages an exterior surface of the housing infrastructure 108. Referring briefly back to FIG. 5, the locking member 192 forms part of an exterior wall 176 of the robot 100. In the portion of the exterior wall 176 shown in FIG. 5, the exterior wall 176 includes the angled surface 154 and a portion of the assembly housing 182. In particular, the locking member 192 includes a first portion 178 of the exterior wall 176 that is recessed inwardly relative to a second portion 180 defined by the angled surface 154. The second portion 180 of the exterior wall 176 surrounds the first portion 178 of the exterior wall 176. Furthermore, the second portion 180 of the exterior wall 176 extends along the plane 175.

A number of implementations have been described. Nevertheless, it will be understood that various modifications may be made.

Controllers and computing devices can implement these operations and other processes and operations described herein. As described above, the controller 109 of the robot 100 can include one or more processing devices connected to the various components, systems, and subsystems of the apparatus 100. The controller 109 can coordinate the operation and cause the apparatus 100 to carry out the various functional operations or sequence of steps described above.

While the robot 100 has been described as an autonomous mobile floor cleaning robot, in some implementations, the robot 100 is an autonomous mobile patrol robot that moves about the floor surface 10 to monitor one or more rooms in an enclosed space, e.g., a home, an office, a hospital, a warehouse, a manufacturing facility, or other enclosed space. Electrical circuitry of the patrol robot includes additional electrical devices that can be protected from abrupt electrostatic discharge through the electrostatic discharge assembly 104. For example, the patrol robot includes an image capture system including a camera that enables the patrol robot to capture digital imagery of the enclosed space. The electrostatic discharge assembly of the patrol robot can protect the image capture system from harm due to sudden electrostatic discharge.

While the cleaning assembly 116 of the robot 100 that contacts the floor surface 10 has been described as including the rotatable members 118, in some implementations, the cleaning assembly 116 includes a single rotatable member that is rotated to ingest the debris. Alternatively, the cleaning assembly 116 includes a cleaning pad that contacts different portions of the floor surface 10 as the robot 100 is navigated along the floor surface 10. The robot 100 is controllable in a manner such that the cleaning pad scrubs the floor surface 10 to remove debris on the floor surface 10.

While the cleaning assembly 116 has been described as including two rotatable members 118, in some implementations, the cleaning assembly 116 includes a single rotatable member that rotates to direct debris toward the debris bin 124. The one or more rotatable members can be rollers with elastomeric outer portions in some implementations, while in other implementations, the one or more rotatable members include bristle brushes.

While the electrostatic discharge assembly 104 has been described as including the locator members 188, 190, in some implementations, the electrostatic discharge assembly 104 includes one, both, or neither of these locator members.

While a single electrostatic discharge member 150 is described, in some implementations, the robot 100 includes multiple electrostatic discharge members. The electrostatic discharge members can be arranged around a perimeter of the housing infrastructure 108, with one or more electrostatic discharge members along the rearward portion 121 of the housing, one or more electrostatic discharge members proximate the lateral sides 130 of the housing infrastructure 108, and one or more electrostatic discharge members along the forward portion 122 of the housing infrastructure 108. The electrostatic discharge members are separated from one another by a distance of at least, for example, 6 to 10 cm, e.g., 6 to 8 cm, 7 to 9 cm, 8 to 10 cm. For example, if the robot 100 includes two electrostatic discharge members, the two electrostatic discharge members are separated by a distance of at least, for example, 6 to 10 cm, e.g., 6 to 8 cm, 7 to 9 cm, 8 to 10 cm.

While the electrostatic discharge member 150 has been described as being disposed on the rearward portion 121 of the housing infrastructure 108, in other implementations, the electrostatic discharge member 150 is positioned on the forward portion 122 of the housing infrastructure 108. Alternatively or additionally, the electrostatic discharge member 150 is positioned proximate the lateral sides of the housing infrastructure 108. In some implementations, at least a portion of the electrostatic discharge assembly 104 is disposed within the debris bin 124. For example, the electrostatic discharge member 150 extends through an exhaust of the debris bin 124.

While the electrostatic discharge member 150 has been described as a brush, in some implementations, other types of electrostatic discharge members are used. For example, the electrostatic discharge member 150 can include a monolithic piece of conductive material, such as stainless steel, carbon fiber, or other conductive material.

Accordingly, other implementations are within the scope of the claims.

What is claimed is:

1. An autonomous mobile robot comprising:
a housing infrastructure;
a drive system comprising one or more wheels to support the housing infrastructure above a floor surface;
a cleaning assembly comprising one or more of a rotatable member and a cleaning pad;
electrical circuitry positioned within the robot housing, the electrical circuitry including a controller to initiate a cleaning operation in which the drive propels the robot across the floor surface while the cleaning assembly cleans the floor surface; and
an electrostatic discharge assembly comprising an electrostatic discharge member that includes a plurality of fibers electrically connected to the electrical circuitry and extending, from the electrical circuitry, to an exterior of the housing infrastructure, wherein the electrostatic discharge member is distinct from the cleaning assembly.

2. The robot of claim 1, wherein:
the electrostatic discharge assembly comprises an assembly housing coupling the electrostatic discharge assembly to the housing infrastructure,
the plurality of fibers comprise proximal ends disposed within the assembly housing and distal ends disposed outside of the assembly housing and outside of the housing infrastructure.

3. The robot of claim 1, wherein:
the cleaning assembly is configured to contact the floor surface during the cleaning operation, thereby causing the robot to accumulate electrostatic charge, and
the electrostatic discharge member is configured to dissipate the accumulated electrostatic charge into an environment of the robot.

4. The robot of claim 1, wherein the electrostatic discharge member extends downward toward the floor surface.

5. The robot of claim 1, wherein a distance between a distal tip portion of the electrostatic discharge member and the floor surface is between 0.2 cm and 1.1 cm.

6. The robot of claim 1, wherein:
a height of the robot relative to the floor surface is no more than 13 centimeters, and
the electrostatic discharge member is positioned at a rearward portion of the housing infrastructure and along a bottom portion of the housing infrastructure.

7. The robot of claim 6, wherein the electrostatic discharge member extends rearwardly from the housing infrastructure.

8. The robot of claim 1, wherein the electrostatic discharge member is within an outer perimeter of the robot and extends toward a rearmost edge of the robot along an axis that forms an angle between 45 and 90 degrees with the floor surface.

9. The robot of claim 1, wherein a minimum distance between a distal tip portion of the electrostatic discharge member and an exterior wall of the housing infrastructure is at least 1 millimeter.

10. The robot of claim 1, wherein:
an exterior wall of the housing infrastructure comprises a first portion recessed inwardly relative to a second portion surrounding the first portion,
the electrostatic discharge member extends out of the housing infrastructure through the first portion of the exterior wall, and
a minimum distance between the distal tip portion and the second portion of the housing infrastructure is at least 1 millimeter.

11. The robot of claim 1, wherein:
the plurality of fibers comprise a plurality of distal tips, and
minimum distances between the plurality of distal tips and the exterior surface of the body are non-uniform.

12. The robot of claim 11, wherein the minimum distances are no more than 1.25 mm.

13. The robot of claim 11, wherein a maximum distance between any two of the plurality of distal tips is no more than 1.25 mm.

14. The robot of claim 11, wherein a diameter of each of the plurality of fibers is between 1 and 10 micrometers.

15. The robot of claim 11, wherein, for each of the plurality of fibers, a length between a proximal end of a fiber and a distal end of the fiber is between 3 and 20 millimeters.

16. The robot of claim 1, wherein a distance between a distal tip portion of the electrostatic discharge member and a rearmost edge of the housing infrastructure is between 1% and 5% of a length of the robot.

17. The robot of claim 1, wherein:
a bottom surface of the housing is no more than 0.7 cm from the floor surface, and
the electrostatic discharge member is positioned above the floor surface such that the electrostatic discharge member does not contact the floor surface during the cleaning operation on the floor surface.

18. The robot of claim 1, further comprising an assembly housing to which the electrostatic discharge member is mounted, the assembly housing comprising a locator member engaged with a corresponding locator member on the housing infrastructure to inhibit relative movement of the portion of the electrical circuitry and the electrostatic discharge member.

19. The robot of claim 1, further comprising a resistor electrically connecting the electrostatic discharge member and the electrical circuitry.

20. The robot of claim 19, wherein an electrical resistance of the electrical resistor is between 1 Kilo-Ohm and 1 Mega-Ohm.

21. The robot of claim 1, wherein the electrostatic discharge member is connected to an electrical ground of the electrical circuitry.

22. The robot of claim 1, wherein the electrostatic discharge member is electrically connected to the electrical circuitry through an electrical wire.

23. The robot of claim 1, wherein the electrostatic discharge member comprises carbon fibers.

24. The robot of claim 23, wherein the electrostatic discharge member extends downward toward the floor surface.

25. The robot of claim 24, wherein a distance between a distal tip portion of the electrostatic discharge member and the floor surface is between 0.2 cm and 1.1 cm.

* * * * *